United States Patent [19]

Ayasli

[11] Patent Number: 4,963,773
[45] Date of Patent: Oct. 16, 1990

[54] LOW PASS/HIGH PASS FILTER PHASE SHIFTER

[75] Inventor: Yalcin Ayasli, Lexington, Mass.

[73] Assignee: Hittite Microwave Corporation, Woburn, Mass.

[21] Appl. No.: 220,737

[22] Filed: Jul. 18, 1988

[51] Int. Cl.⁵ .................. H01C 1/082; H03K 3/26; H03K 5/13
[52] U.S. Cl. .................. 307/511; 307/304; 307/520; 328/55; 333/138; 333/165
[58] Field of Search .............. 307/511, 520, 262, 571, 307/572, 304; 328/55, 56, 155; 333/138, 139, 164, 165, 1

[56] References Cited

U.S. PATENT DOCUMENTS

| | | | |
|---|---|---|---|
| 3,179,816 | 4/1965 | Hall et al. | 307/256 |
| 3,665,320 | 5/1972 | Ohsawa et al. | 307/571 |
| 3,716,730 | 2/1973 | Cerny, Jr. | 307/304 |
| 3,882,431 | 5/1975 | Hopwood et al. | 333/139 |
| 4,158,149 | 6/1979 | Otofuji | 307/571 |
| 4,176,332 | 11/1979 | Bachert | 333/218 |
| 4,220,874 | 9/1980 | Iwata et al. | 307/256 |
| 4,701,714 | 10/1987 | Agoston | 333/139 |

Primary Examiner—Stanley D. Miller
Assistant Examiner—Timothy P. Callahan
Attorney, Agent, or Firm—Joseph S. Iandiorio

[57] ABSTRACT

A compact low pass/high pass filter phase shifter including a semiconductor switch having a control electrode and first and second load electrodes; a first inductance connected in series with one load electrode and second inductance connected in series with the other load electrode; a third inductance connected in parallel with one load electrode to ground and a fourth inductance connected in parallel with the other load electrode to ground; a capacitance connected in series between the control electrode and ground; and means for applying a control signal to the control electrode for switching the semiconductor switch between a first state in which it operates as a low pass filter and a second state in which it operates as a high pass filter to introduce a phase shift in a propagated signal.

5 Claims, 2 Drawing Sheets

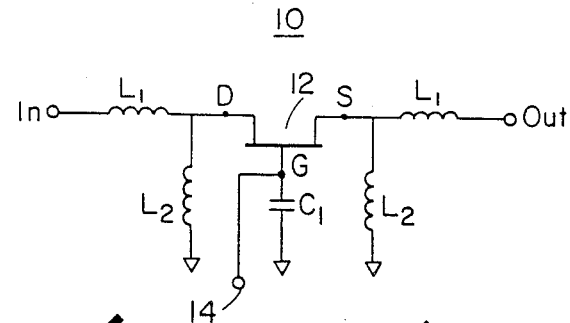
Fig 1
ON STATE          OFF STATE
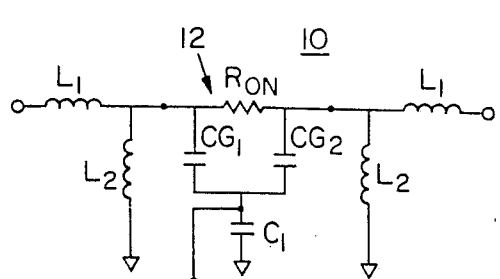 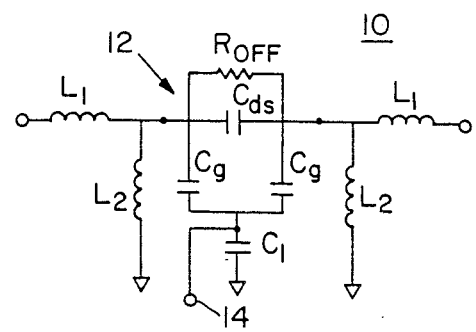
Fig. 2A          Fig. 2B
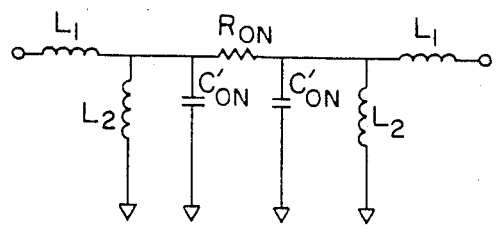 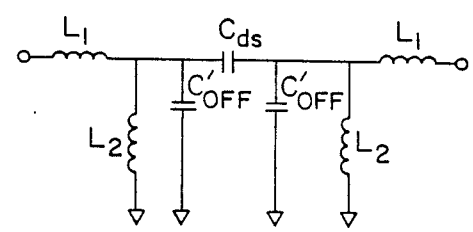
Fig. 3A          Fig. 3B
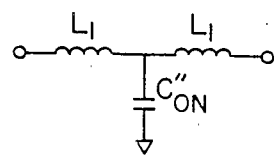 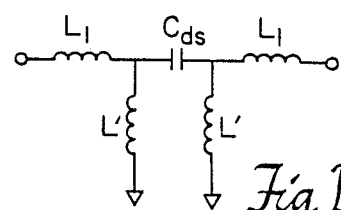
Fig. 4A          Fig. B

INPUT

OUTPUT
(High Pass)
90° Advance

OUTPUT
(Low Pass)
90° Delay

LOW PASS/HIGH PASS FILTER PHASE SHIFTER

FIELD OF INVENTION

This invention relates to an improved monolithic phase shifter circuit and phase shifter system.

SUMMARY OF INVENTION

It is an object of this invention to provide an improved phase shifter which is simple and easy to monolithically fabricate.

It is a further object of this invention to provide an improved phase shifter which is symmetrical in its features and uses a minimum of components.

This invention features a compact low pass/high pass filter phase shifter circuit including a semiconductor switch having a control electrode and first and second load electrodes. There is a first inductance connected in series with one load electrode and a second inductance connected in series with the other load electrode. A third inductance is connected in parallel with one load electrode to ground and the fourth inductance is connected in parallel with the other load electrode to ground. The capacitance is connected in series between the control electrode and ground. There are means for applying a control signal to the control electrode for switching the semiconductor switch between a first state in which it operates as a low pass filter and a second state in which it operates as a high pass filter to introduce a phase shift in a propagated signal.

In a preferred embodiment, the semiconductor switch is an FET transistor, the control electrode is the gate and the load electrodes are the drain and source. The capacitance may be in the range of 1 pF, the inductances in the range of 1 nanoHenry, and the FET gate periphery may be approximately 1 millimeter. Preferably, the first and second inductances are equal, as are the third and fourth inductances.

DISCLOSURE OF PREFERRED EMBODIMENT

Other objects, features and advantages will occur from the following description of a preferred embodiment and the accompanying drawings, in which:

FIG. 1 is a schematic of a phase shifter circuit according to this invention;

FIG. 2A is an equivalent representation of the circuit of FIG. 1 in the on state;

FIG. 2B is an equivalent representation of the circuit of FIG. 1 in the off state;

FIGS. 3A and 3B are equivalent circuit simplifications of FIGS. 2A and 2B;

FIGS. 4A and 4B are further equivalent circuit simplifications of FIGS. 3A and 3B.

Figure 5A:
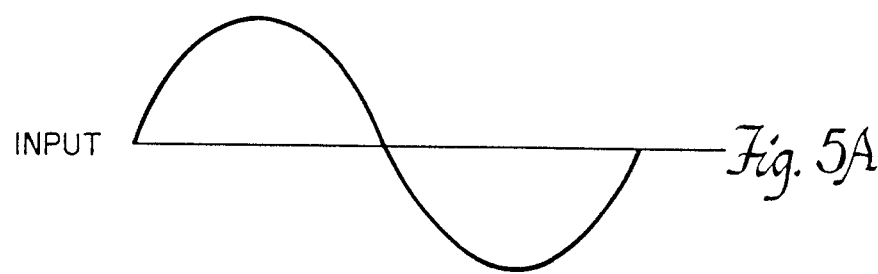
FIGS. 5A, 5B and 5C illustrate an input wave and the phase shifts obtainable with the circuit according to this invention.

The invention may be accomplished in a circuit using a semiconductor switch such as an FET with its gate connected through a capacitor to ground and with its drain and source electrodes each connected in series with an inductance and with additional inductances connected from each of the drain and source electrodes to ground. Such a design is easy to fabricate monolithically and very simple in design. It is symmetrical with a central FET, a gate capacitor and a series and parallel inductance at the input and the output. It uses a minimum of components, e.g., only one semiconductor, and is extremely small in area, approximately 2% or less of the area of the earliest available monolithic phase shifter circuits.

There is shown in FIG. 1 a phase shifter circuit 10 according to this invention which includes a semiconductor such as FET 12 having its gate G connected through capacitor C1 to ground and having its drain and source each connected to an inductance $L_1$. In addition, each of the drain and source is connected through a second inductance $L_2$ to ground. There is some means for applying a control signal to the gate of FET 12 such as terminal 14.

In a specific application where it is desired, an approximately 50 ohm input impedance and a 50 ohm output impedance is obtained using a capacitor $C_1$ which has a value in the range of 1 pF, inductances $L_1$ and $L_2$ which have an inductance in the range of 1 nanoHenry and an FET which has an approximately 1 millimeter gate periphery.

When a zero volt bias is applied to terminal 14, phase shifter circuit 10 switches to the on state in which it is a low pass filter that passes at least up to, for example, 11 GHz. With a $-5$ volt bias applied to terminal 14, the circuit switches to its off state in which it becomes a high pass filter and passes, for example, 9 GHz and over, so that in summary circuit 10 will operate as a 10 GHz plus or minus 10% band pass filter. In the on state, as shown in FIG. 2A, the equivalent circuit appears as before with respect to inductances $L_1$, $L_2$ and capacitance $C_1$ but FET 12 is now represented by its conducting resistance $R_{on}$, and capacitances $CG_1$ and $CG_2$ where Ron is a negligible resistance typically in the order of 4 ohms, for example. The equivalent circuit of FIG. 2A can be further simplified, as shown in FIG. 3A, where capacitances $CG_1$, $CG_2$ and $C_1$ are resolved into only two capacitances $C'_{on}$ and $C'_{on}$. Finally, as shown in FIG. 4A, since $R_{on}$ is negligible the circuit reduces to a simple low pass filter with two inductances $L_1$ and $L_1$ and one capacitance $C''_{on}$. The impedance of parallel inductances $L_2$ are such that they may be disregarded with respect to the capacitances $C'_{on}$ in FIG. 3A so that the simplified equivalent circuit becomes as shown in FIG. 4A.

With a $-5$ volt signal applied to terminal 14, phase shifter 10 switches to the off state and assumes the equivalent circuit condition, as shown in FIG. 2B. There FET 12 in the off condition is represented by its off resistance $R_{off}$, its drain and source capacitance $C_{ds}$ and the gate capacitance $C_g$. This circuit can be simplified, as shown in FIG. 3B, so that $R_{off}$ which is in the neighborhood of 2000 ohms becomes negligible in view of the much lower reactance or impedance of the capacitance $C_{ds}$. The three capacitances $C_g$, $C_g$ and $C_1$ can be simplified into capacitance $C'_{off}$, and the final simplification of FIG. 4B shows that the capacitances $C'_{off}$ and the inductances $L_2$ can be represented by the simple inductances $L'$ so that the entire circuit takes on the appearance of a high pass filter.

Figure 5B:
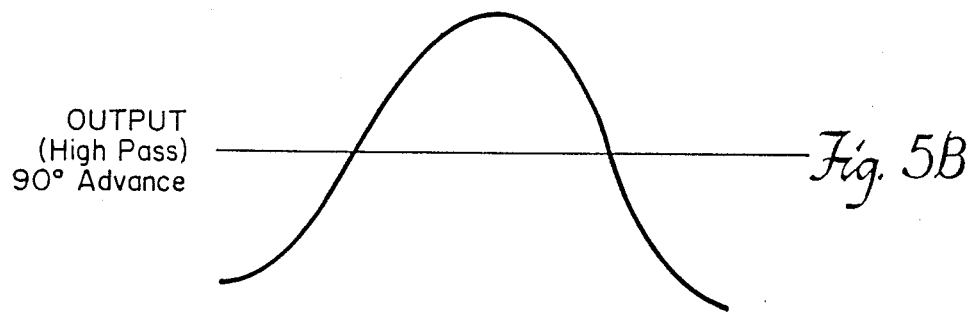
Figure 5C:
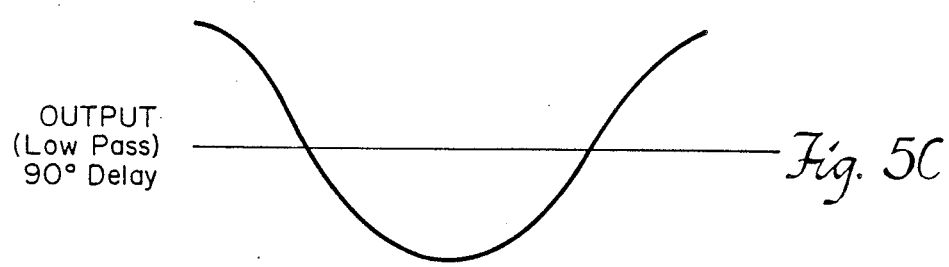

In operation a sinusoidal signal, such as shown in FIG. 5A, presented at the input of phase shifter 10 can be advanced by 90 degrees, as shown in FIG. 5B, by providing a $-5$ volt bias at terminal 14 to drive circuit 10 to the off state, or the output can be imparted with a 90-degree delay, as shown in FIG. 5C when a zero volt bias is provided to terminal 14 to switch circuit 10 to the on state. If either the 90-degree advance position or 90-degree delay position is assumed as a base position, then it can be seen that the simplified symmetrical phase shifter circuit 10 can be used to provide a 180 degree phase shift.

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. A compact, low pass/high pass filter phase shifter circuit comprising:
    a semiconductor switch having a control electrode and first and second load electrodes;
    a first inductance connected in series with one load electrode, and a second inductance connected in series with the other load electrode;
    a third inductance connected in parallel with one load electrode to ground and a fourth inductance connected in parallel with the other load electrode to ground;
    a capacitance connected in series between said control electrode and ground; and
    means for applying a control signal to said control electrode for switching said semiconductor switch between a first state in which it operates as a low pass filter and a second state in which it operates as a high pass filter to introduce a phase shift in a propagated signal.

2. The phase shifter circuit of claim 1 in which said semiconductor switch is an FET transistor, said control electrode is the gate and said load electrodes are the drain and source.

3. The phase shifter circuit of claim 1 in which the capacitance is in the range of 1 pF, the inductances are in the range of 1 nanoHenry and the FET has an approximately one millimeter gate periphery.

4. The phase shifter circuit of claim 1 in which said first and second inductances are equal.

5. The phase shifter circuit of claim 1 in which said third and fourth inductances are equal.

* * * * *